United States Patent [19]
Kano et al.

[11] Patent Number: 5,568,115
[45] Date of Patent: Oct. 22, 1996

[54] ARTIFICIAL LATTICE FILM AND MAGNETO-RESISTANCE EFFECT ELEMENT USING THE SAME

[75] Inventors: Hiroshi Kano; Atsuko Suzuki; Kiyoshi Kagawa; Akihiko Okabe, all of Kanagawa, Japan

[73] Assignee: Sony Corporation, Tokyo, Japan

[21] Appl. No.: 356,588

[22] Filed: Dec. 15, 1994

[30] Foreign Application Priority Data

Dec. 27, 1993 [JP] Japan .................. 5-329317

[51] Int. Cl.$^6$ .............................. H01L 43/00
[52] U.S. Cl. ........................ 338/32 R; 360/113
[58] Field of Search ................ 338/32 R, 32 H; 360/113

[56] References Cited

U.S. PATENT DOCUMENTS

| | | | |
|---|---|---|---|
| 3,480,522 | 11/1969 | Brownlow | 204/40 |
| 4,663,607 | 5/1987 | Kitada et al. | 338/32 H |

FOREIGN PATENT DOCUMENTS

| | | |
|---|---|---|
| 0471946A2 | 2/1992 | European Pat. Off. . |
| 526044 | 2/1993 | European Pat. Off. . |
| 0526044A1 | 3/1993 | European Pat. Off. . |
| 581295 | 2/1994 | European Pat. Off. ............. 338/32 R |
| 4-280483 | 10/1992 | Japan ................... 332/32 R |

OTHER PUBLICATIONS

R. Hart, et al., "Magnetoresistance in Ni–Co–Cu/Cu Multi-layers Electrodeposited onto (100) n–type Gallium Arsenide Substrates", Extended Abstracts, vol. 92, No. 2, pp. 406–407, Oct. 10, 1993, New Orleans.

Encyclopaedic Dictionary of Physics, Thewlis, 1961, pp. 476–477.

Hart et al., "Magnetoresistance in Ni–Co–Cu/Cu Multilayers Electrodeposited . . . Onto Substrates". Extended Abstracts, vol.92, pp. 406–407, Oct. 1993.

*Primary Examiner*—Teresa J. Walberg
*Assistant Examiner*—Karl Easthom
*Attorney, Agent, or Firm*—Hill, Steadman & Simpson

[57] ABSTRACT

An artificial lattice film is constituted as a multilayered film in which magnetic layers containing Cu of 1~50 atomic percentage and at least one component selected from Fe, Ni and Co and conductive layers are stacked one after another. By forming such an artificial lattice film on a non-magnetic substrate, a magneto-resistance effect element having excellent characteristic for use as magnetic head or magnetic sensor is provided.

7 Claims, 2 Drawing Sheets

ARTIFICIAL LATTICE FILM AND MAGNETO-RESISTANCE EFFECT ELEMENT USING THE SAME

BACKGROUND OF THE INVENTION

1. Field of the Invention

This invention relates to an artificial lattice film having high magnetic resistance ratio (MR ratio) and a magneto-resistance effect element using such an artificial lattice film.

2. Description of the Related Art

Magneto-resistance effect devices (elements) for detecting magnetic field by using magneto-resistance effect are extensively used at present as magnetic sensor, magnetic head, rotation detecting device, position detecting device, and the like.

Permalloy generally mentioned as material to exhibit magneto-resistance effect has small anisotropic magnetic field of the order of 4 Gauss, and indicates very satisfactory soft magnetic characteristic. For this reason, in the field of magnetic recording, permalloy is suitable for material for MR head which reads out very weak signal magnetic field.

However, in order to cope with high density magnetic recording forecasted or predicted to be further developed in Future, material having larger MR ratio is required.

In an artificial lattice film as multi layered film made up so that magnetic layers consisting of Fe and conductive layers consisting of Cr are successively stacked one after another, MR ratio of about 50% was observed under the condition of low temperature of 4.2K and magnetic field 2 T, and the spot light of attention on this observed result was focused (M. N. Baibich, et al; Phys. Rev. Lett. 61(1988)2472.).

Thereafter, in the artificial lattice film in which Co and Cu are respectively used as the magnetic layer and the conductive layer, in the case where there is employed, e.g., a multilayered structure of (Co 1.5 nm–Cu 0.9 nm)×30 layers, MR ratio of 48% was observed under the condition of room temperature and magnetic field of 0.5 T. Moreover, in the case where a multilayered structure of (Co 1.5 nm–Cu 2 nm)×30 layers is employed, MR ratio of about 19% was observed under the condition of room temperature and the magnetic field of 0.05 T (D. H. Mosca et al; J. Mag. Magn. Mat. 94(1991)L1.).

In order to obtain larger MR ratio, various artificial lattice films (film structures) were made up. However, since large external magnetic field is required, it is difficult to apply such artificial lattice film, e.g., as magneto-resistance effect element for magnetic recording. In addition, sensitivity was insufficient also as a magnetic sensor.

In view of the above, there has been proposed a method in which alloy including Fe, Ni, Co in combination is used in place of using Fe or Co by itself as the magnetic layer to thereby improve sensitivity with respect to external magnetic field. In the case where magnetic layer is constituted by alloy as described above, it is necessary to contain Co of 10% or more in order to obtain sufficient MR ratio. However, when percentage content of Co is high, coercive force is increased, resulting in the drawback that accuracy was low for use as, e.g., magnetic head or magnetic sensor.

As stated above, conventional artificial lattice films (film structures) were insufficient in the case they are used as magneto-resistance effect element for magnetic head or magnetic sensor.

OBJECTS AND SUMMARY OF THE INVENTION

This invention has been proposed in view of actual circumstances as described above, and its object is to provide an artificial lattice film including magnetic layers in which sufficient MR ratio can be obtained without necessity of large external magnetic field and coercive force is suppressed. Another object of the invention is to provide a magneto-resistance effect element using such an artificial lattice film.

To achieve the above-mentioned objects, in accordance with this invention, there is provided an artificial lattice film in which magnetic layers and conductive layers are stacked one after another, characterized in that the magnetic layer contains Cu of 1~50 atomic percentage, and contains at least one component selected from Fe, Co and Ni.

Further, in accordance with this invention, there is provided a magneto-resistance effect element in which the artificial lattice film according to this invention, i.e., the artificial lattice film in which magnetic layer contains Cu of 1~50 atomic percentage and at least one component selected from Fe, Co and Ni is formed on a non-magnetic substrate.

It should be noted that if the percentage content of Cu in the magnetic layer is less than the above-mentioned range, sufficient MR ratio cannot be obtained, and coercive force also becomes grater. On the other hand, if percentage content of Cu is too great, the effect to increase the MR ratio is weakened.

Further, it is preferable to determine, in order to improve sensitivity with respect to an external magnetic field, composition ratio of Fe, Co and Ni included in the magnetic layer as described below:

When composition formula is assumed to be expressed as $Fe_xCo_yNi_z$ (x, y, z are atomic percentage), $$10 \leq x \leq 25,\ 40 \leq y \leq 80,\ 10 \leq z \leq 40,\ x+y+z=100.$$

On the other hand, as the conductive layer, Cr or Cu conventionally used as the conductive layer of the artificial lattice film can be used. It is preferable that its film thickness is 1.8~2.8 nm. Value of the MR ratio changes (fluctuates) also in dependency upon the film thickness of the conductive layer. Namely, if the film thickness is too thinner than the above-mentioned range, or is thicker than that, the MR ratio would be deteriorated.

As a method of forming the magnetic layer and the conductive layer, methods well know in the prior art can be all used. For example, vacuum deposition method, sputtering method, ion plating method and the like are enumerated. It is preferable to form film by sputtering method using target having the above-described composition ratio. As the sputtering method, RF magnetron system, DC magnetron system, opposed target system and the like are effective. It is here noted that since MR ratio of artificial lattice film made up changes in dependency upon the condition of gas pressure, etc. at the time of formation of film, it is required to reasonably adjust the film formation condition.

As non-magnetic substrate on which artificial lattice film as described above is formed, photo-ceramic, quartz glass, polyimide and the like may be used. Moreover, it is also possible to use substrate of. GaAs, Si, MgO of single crystal, etc. by taking epitaxial growth of artificial lattice film into consideration. It should be noted that Young's modulus is $1 \times 10^9\ Nm^{-2}$ or more. If Young's modulus is smaller than the above-mentioned value, distortion might take place in the lattice of the artificial lattice film when any external force is applied to the magneto-resistance effect element. For this reason, MR ratio would be deteriorated.

The reason why large MR ratio can be attained in an artificial lattice film as described above can be considered as follows. Namely, RKKY (Ruderman, Kittel, Kasuya, Yoshida) interaction takes place between magnetic layers through conduction electrons in the conductive layer so that opposite magnetic layers are coupled in a diamagnetic manner, so spin dependent scattering would take place.

The above-mentioned MR ratio can be determined by measuring magnetic resistance by the four terminal method to calculate its change rate.

By containing Cu in the magnetic layer, there can be formed magnetic layer in which coercive force is suppressed while sufficient large MR ratio is ensured. Further, by containing Fe, Ni or Co, sensitivity with respect to an external magnetic field can be improved.

For this reason, when artificial lattice as multilayered film having such magnetic layers is applied as magneto-resistance effect element for magnetic head or magnetic sensor, such magnetic head or sensor is permitted to have very high performance.

DESCRIPTION OF THE PREFERRED EMBODIMENT

A preferred embodiment in more practical sense to which this invention is applied will now be described on the basis of experimental results.

Experiment 1

With respect to magneto-resistance effect element using $(Fe_{20}Ni_{80})_{90-x}Co_{10}Cu_x$ as magnetic layer, change of MR ratio by percentage content of Cu in the magnetic layer was examined.

Figure 1:
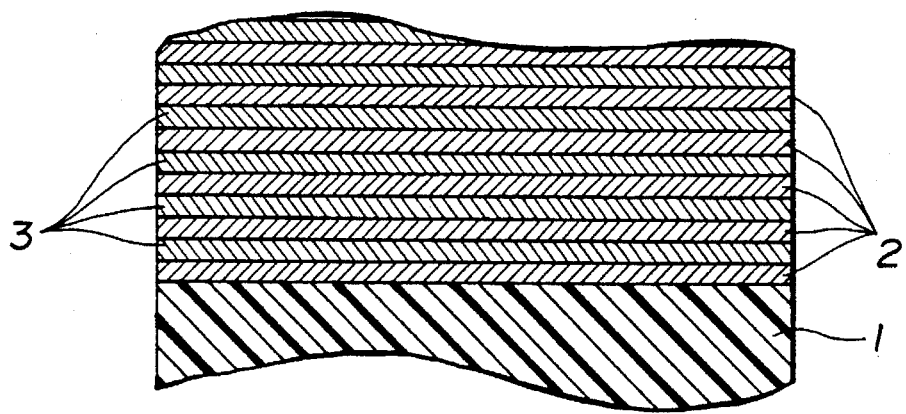
FIG. 1 is a cross sectional view showing, in a model form, structure of a magneto-resistance effect element of this invention.

Magneto-resistance effect element used here is such that an artificial lattice film in which 30 magnetic layers 2 consisting of $(Fe_{20}Ni_{80})_{90-x}Co_{10}Cu_x$ and having each film thickness of 1.0 nm and 30 conductive layers 3 consisting of Cu and having each film thickness of 2.1 nm are stacked one after another is formed on non-magnetic substrate 1 consisting of slide glass as shown in FIG. 1.

For film formation of the artificial lattice film, RF magnetron sputtering system was used.

Figure 2:
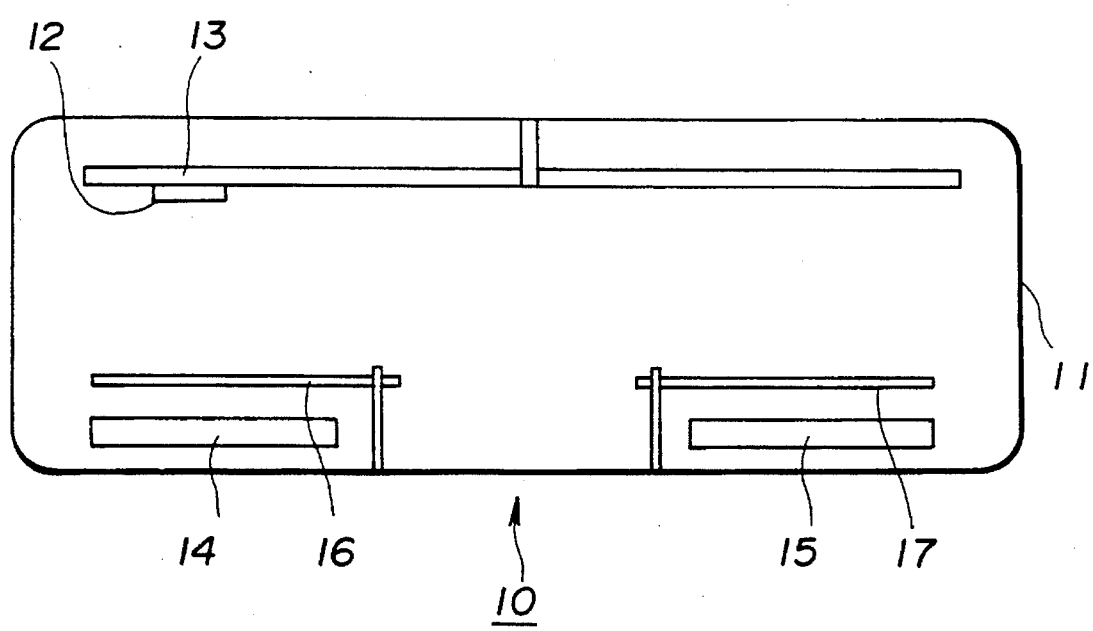
FIG. 2 is a model view showing the configuration of a sputtering system used for manufacturing the magneto-resistance effect element of this invention.

This sputtering system 10 comprises, within chamber 11, as shown in FIG. 2, a substrate holder 12 for holding non-magnetic substrate 1, a rotary plate 13 for rotating the non-magnetic substrate 1, a target 14 consisting of $(Fe_{20}Ni_{80})_{90-x}Co_{10}Cu_x$, a target 15, similar to the above target, consisting of Cu, and shutters 16, 17 for controlling start/stop of film formation onto non-magnetic substrate 1.

In addition, although not shown, gas inlet for introducing sputtering gas and outlet for exhausting gas are provided at chamber 11.

In order to actually form magnetic layers 2 and conductive layers 3 by using the above-described sputtering system 10, exhausting within in chamber 11 was carried out from the outlet. Thereafter, Ar gas was introduced as sputtering gas from the gas inlet so that gas pressure is equal to 0.5 Pa. Further, in the state where non-magnetic substrate 1 is rotated by rotary plate 13, targets 14, 15 were sputtered while allowing shutters 16, 17 to be closed. Then, in forming magnetic layers 2, shutter 16 above target 14 was opened. On the other hand, in forming conductive layers 3, the shutter 16 was closed and shutter 17 above target 15 was opened. By carrying out switching between shutters 16, 17 to be opened in this way, magnetic layers 2 consisting of $(Fe_{20}Ni_{80})_{90-x}Co_{10}Cu_x$ and conductive layers 3 consisting of Cu are deposited one after another on non-magnetic substrate 1. At this time, film formation speed (rate) was 0.1 ~0.5 nm/sec.

Artificial lattice film (structure) in which 30 magnetic layers 2 and 30 conductive layers 3 are respectively stacked in a manner as described above was formed. Thus, magneto-resistance effect element was completed. In this case, magneto-resistance effect elements were prepared by diversely changing percentage content x of Cu in magnetic layers 2 consisting of $(Fe_{20}Ni_{80})_{90-x}Co_{10}Cu_x$ in the range expressed as $0 \leq x \leq 70$ (atomic percentage).

Then, the magneto-resistance effect element made up in a manner as described above is caused to be a test piece of 5 mm×10 mm, and resistance in the condition of external magnetic field 0 kOe and resistance in the condition of external magnetic field 1 kOe were measured by the d.c. four terminal method. Then, assuming that resistance value under the condition of external magnetic field 0kOe is $R_0$ and resistance value under the condition of external magnetic field 1kOe is $R_S$, MR ratio ΔR was calculated by the following formula (1):

$$\Delta R = (R_0 - R_S)/R_S \quad (1)$$

Figure 3:
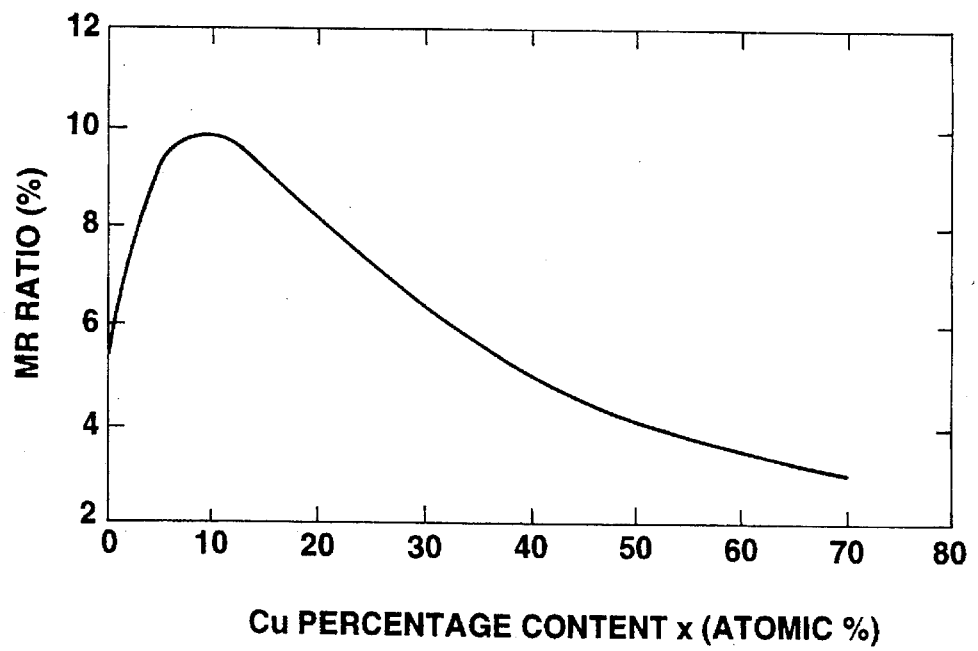
FIG. 3 is a characteristic diagram showing the relationship between percentage content of Cu in magnetic layer and MR ratio.

This result was shown in FIG. 3 as change of MR ratio with respect to percentage content x of Cu in magnetic layer 2. From FIG. 3, it is seen that MR ratio can be increased by containing Cu into magnetic layer 2. However, if percentage content of Cu is too great, the effect to increase MR ratio is weakened. For this reason, it is preferable that x in magnetic layer 2 consisting of $(Fe_{20}Ni_{80})_{90-x}Co_{10}Cu_x$ is caused to be $1 \leq x \leq 50$ (atomic percentage). In order to obtain greater MR ratio, it is preferable that x is caused to be $5 \leq x \leq 25$ (atomic percentage).

As stated above, from the above experiment, it has been seen that percentage content of Cu in the magnetic layer is caused to be 1~50 atomic percentage, thereby making it possible to provide magneto-resistance effect element having high MR ratio.

Experiment 2

In this case, with respect to magneto-resistance effect element using $(Fe_{20}Ni_{55}Co_{35})_{100-y}Cu_y$ as magnetic layer, change of coercive force Hc by percentage content of Cu in the magnetic layer was examined.

In more practical sense, magneto-resistance effect element was made up similarly to the above-mentioned experiment 1 except that magnetic layer 2 is caused to consist of $(Fe_{20}Ni_{55}Co_{35})_{100-y}Cu_y$ and percentage content y of Cu is changed within a range expressed as $0 \leq y \leq 70$ (atomic percentage). Then, the magneto-resistance effect element made up in a manner as described above is caused to be a test piece of 7 mm×7 mm, and coercive force Hc was measured.

Figure 4:
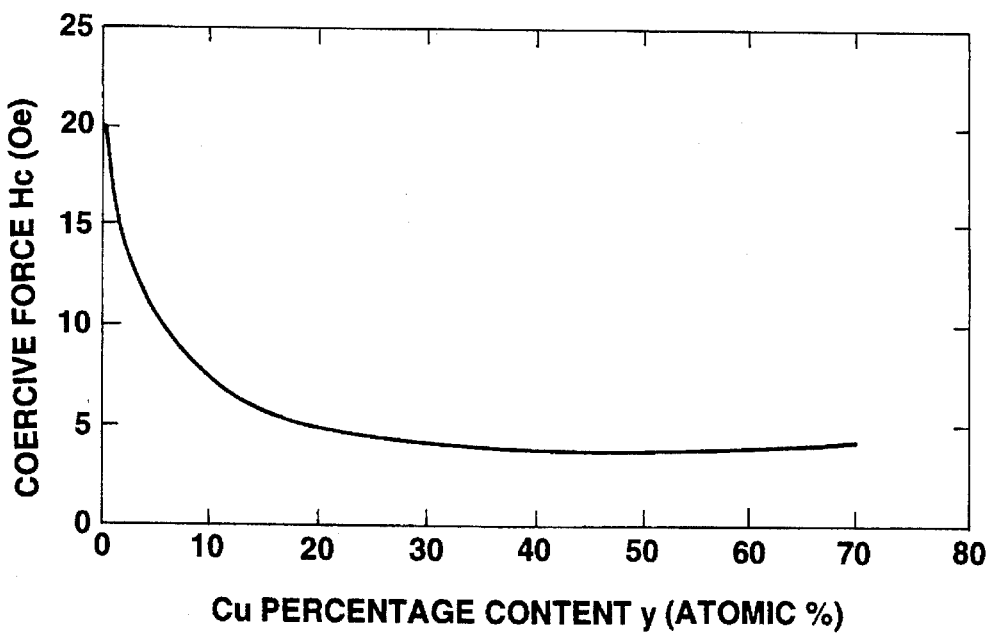
FIG. 4 is a characteristic diagram showing the relationship between percentage content of Cu in magnetic layer and coercive force HC.

This result was shown in FIG. 4 as change of coercive force Hc with respect to percentage content y of Cu in magnetic layer 2. From FIG. 4, it has been seen that Cu is contained into magnetic layer 2, thereby making it possible to lower coercive force. It should be noted that even if Cu of 30 atomic percentage or more is contained, the effect to lower coercive force is not so changed.

As described above, it has been seen from the above experiment that percentage content of Cu in magnetic layer is caused to be 1~50 atomic percentage, thereby making it possible to provide magneto-resistance effect element having small coercive force, i.e., small hysteresis.

Experiment 3

In this experiment, various non-magnetic substrates 1 having different Young's modulus were used to make up magneto-resistance effect elements to examine deterioration of MR ratio after external force is applied thereto.

In actual terms, non-magnetic substrates 1 consisting of epoxy resin, nitrocellulose, nylon 66, polyethylene terephthalate (PET), low density polyethylene, natural rubber which are 2 cm in thickness, 2 cm in length and 1 mm in thickness respectively having Young's modulus shown in the following table were prepared to make up magneto-resistance effect elements similarly to the above-mentioned experiment 1.

TABLE 1

| NON-MAGNETIC SUB-STRATE MATERIAL | YOUNG'S MODULUS $(N\ m^{-2})$ | EVALUATION |
| --- | --- | --- |
| EPOXY RESIN | $2.5 \times 10^9$ | 0 |
| NITROCELLULOSE | $5.5 \times 10^9$ | 0 |
| NYLON 66 | $2.6 \times 10^9$ | 0 |
| PET | $2.0 \times 10^9$ | 0 |
| LOW DENSITY POLY-ETHYLENE | $0.2 \times 10^9$ | x |
| NATURAL RUBBER | $0.003 \times 10^9$ | x |

Then, with respect to samples of magneto-resistance effect elements made up in a manner as described above, MR ratios were determined in the same manner as that conducted in the above-mentioned experiment 1. Further, external force P was applied so that respective samples were bent by 175 degrees thereafter to similarly determine MR ratios for a second time.

Evaluation was conducted such that in the case where MR ratio after external force P is applied was greatly deteriorated, this was evaluated as x, whereas in the case where equal MR ratio was obtained, this was evaluated as 0. This evaluation results are shown in the above-mentioned Table 1 together.

From the Table 1, it is seen that even if external force P is applied in samples of magneto-resistance effect elements using non-magnetic substrates 1 having Young's modulus of $1.0\times10^9\ Nm^{-2}$ or more, MR ratios were not deteriorated.

As described above, it has been seen from the above-mentioned experiment that when material having Young's modulus of $1.0\times10^9\ Nm^{-2}$ or more is used as non-magnetic substrate, magneto-resistance effect elements in which MR ratio is difficult to be deteriorated by external force are obtained.

As is clear from the foregoing description, when this invention is applied, artificial lattice film and magneto-resistance effect element having high MR ratio and small coercive force can be provided. Accordingly, if magneto-resistance effect element according to this invention is applied to, e.g., magnetic head or magnetic sensor, such magnetic head or sensor is caused to have high performance.

What is claimed is:

1. A magneto-resistance effect element comprising:

a non-magnetic substrate having a Young's modulus of $1.0\times10^9\ Nm^{-2}$ or more; and a sputtered artificial lattice film disposed on a surface of the substrate, said artificial lattice film having a multilayer structure of alternating magnetic layers and conductive layers, each said magnetic layer having a composition of the formula $$(Fe_xCo_yNi_z)_{100-n}Cu_n$$

wherein x, y, z and n are atomic percentages such that $10 \leq x \leq 25$, $40 \leq y \leq 80$, $10 \leq z \leq 40$, x+y+z=100, and $1 \leq n \leq 50$, and having a film thickness of about 1 nm, and each said conductive layer consisting of Cu or Cr and having a film thickness of from about 1.8 to about 2.8 nm, said magneto-resistance effect element having an MR ratio of at least about 4%.

2. A magneto-resistance effect element as defined in claim 1, wherein in the formula n has a value of greater than or equal to 5 and less than or equal to 25, and said magneto-resistance effect element has an MR ratio of at least about 7% and a coercive force Hc of about 10 Oe or less.

3. A magneto-resistance effect element as defined in claim 1, wherein each said magnetic layer comprises a composition of the formula $$(Fe_{20}Ni_{80})_{90-m}Co_{10}Cu_m,$$

wherein m is from 1 to 50.

4. A magneto-resistance effect element as defined in claim 1, wherein each said magnetic layer comprises a composition of the formula $$(Fe_{20}Ni_{55}CO_{35})_{100-n}Cu_n,$$

wherein n is from 1 to 50.

5. A magneto-resistance effect element as defined in claim 1, wherein said artificial lattice film contains about 30 magnetic layers and about 30 conductive layers.

6. A magneto-resistance effect element as defined in claim 1, wherein said non-magnetic substrate comprises a material selected from the group consisting of epoxy resin, nitrocellulose, Nylon 66 and polyethylene terephthalate.

7. A magneto-resistance effect element as defined in claim 1, wherein said artificial lattice film is sputtered by RF magnetron sputtering.

* * * * *